United States Patent
Okuno et al.

(10) Patent No.: US 7,863,682 B2
(45) Date of Patent: *Jan. 4, 2011

(54) SIC SEMICONDUCTOR HAVING JUNCTION BARRIER SCHOTTKY DIODE

(75) Inventors: Eiichi Okuno, Mizuho (JP); Takeo Yamamoto, Nishikamo-gun (JP)

(73) Assignee: Denso Corporation, Kariya (JP)

( * ) Notice: Subject to any disclaimer, the term of this patent is extended or adjusted under 35 U.S.C. 154(b) by 261 days.

This patent is subject to a terminal disclaimer.

(21) Appl. No.: 12/078,350

(22) Filed: Mar. 31, 2008

(65) Prior Publication Data

US 2008/0277668 A1    Nov. 13, 2008

(30) Foreign Application Priority Data

May 10, 2007    (JP)    ............................. 2007-125593

(51) Int. Cl.
*H01L 29/24* (2006.01)
*H01L 29/94* (2006.01)

(52) U.S. Cl. ....................... 257/339; 257/340; 257/341; 257/342; 257/343; 257/452; 257/453; 257/471; 257/493; 257/E29.104; 257/E29.026; 257/E29.27

(58) Field of Classification Search ................. 257/339, 257/492, 493, 340, 341, 342, 343, E29.026, 257/E29.104, 453, 471, E29.27
See application file for complete search history.

(56) References Cited

U.S. PATENT DOCUMENTS

| 7,508,045 | B2 | 3/2009 | Nishio et al. | |
| 2002/0125482 | A1* | 9/2002 | Friedrichs et al. | ............. 257/73 |
| 2008/0258153 | A1 | 10/2008 | Yamamoto et al. | |
| 2009/0057686 | A1* | 3/2009 | Fukuda et al. | ................ 257/77 |

FOREIGN PATENT DOCUMENTS

| JP | A-7-086621 | 3/1995 |
| JP | A-10-321879 | 12/1998 |
| JP | A-2000-252478 | 9/2000 |
| JP | A-2000-294804 | 10/2000 |
| JP | A-2001-85704 | 3/2001 |

(Continued)

OTHER PUBLICATIONS

Office Action dated Feb. 24, 2010 issued from the U.S. Patent and Trademark Office for the related U.S. Appl. No. 12/078,370.

(Continued)

*Primary Examiner*—Long K Tran
(74) *Attorney, Agent, or Firm*—Posz Law Group, PLC (57) ABSTRACT

A semiconductor device having a junction barrier Schottky diode includes: a SiC substrate; a drift layer on the substrate; an insulation film on the drift layer having an opening in a cell region; a Schottky barrier diode having a Schottky electrode contacting the drift layer through the opening of the insulation film and an ohmic electrode on the substrate; a terminal structure having a RESURF layer surrounding the cell region; and multiple second conductive type layers on an inner side of the RESURF layer. The second conductive type layers and the drift layer provide a PN diode. The Schottky electrode includes a first Schottky electrode contacting the second conductive type layers with ohmic contact and a second Schottky electrode contacting the drift layer with Schottky contact.

8 Claims, 7 Drawing Sheets

FOREIGN PATENT DOCUMENTS

| | | |
|---|---|---|
| JP | A-2002-314099 | 10/2002 |
| JP | A-2003-158259 | 5/2003 |

OTHER PUBLICATIONS

Office Action dated Apr. 28, 2009 from Japan Patent Office in the corresponding JP Application No. 2007-125593 (and English Translation).

Office Action dated Apr. 28, 2009 from Japan Patent Office in the corresponding JP Application No. 2007-125594 (and English Translation).

U.S. Appl. No. 12/078,370, filed Mar. 31, 2008, Okuno et al.

Notice of Allowance mailed Jun. 29, 2010 in the corresponding U.S. Appl. No. 12/078,370.

\* cited by examiner

SIC SEMICONDUCTOR HAVING JUNCTION BARRIER SCHOTTKY DIODE

CROSS REFERENCE TO RELATED APPLICATIONS

This application is based on Japanese Patent Application No. 2007-125593 filed on May. 10, 2007, the disclosure of which is incorporated herein by reference. This application is also related to U.S. application Ser. No. 12/078,370, entitled "SIC SEMICONDUCTOR DEVICE HAVING JUNCTION BARRIER SHOTTOKY DIODE," filed on Mar. 31, 2008.

FIELD OF THE INVENTION

The present invention relates to a SiC semiconductor device having a junction barrier Schottky diode.

BACKGROUND OF THE INVENTION

A Schottky barrier diode (i.e., SBD) includes a Schottky electrode, which contacts a semiconductor layer. An interface between the Schottky electrode and the semiconductor layer has a small work function between metallic material composing the Schottky electrode and semiconductor material composing the semiconductor layer. Accordingly, when a reverse voltage is applied to the diode, a leak current in the SBD is larger than a PN junction type diode.

JP-2000-294804 discloses a construction having a Schottky junction and a PN diode. Specifically, the PN diode is formed in a part of the Schottky junction, so that a leak current is reduced when a reverse voltage is applied to the construction. More specifically, a Schottky electrode contacts a N⁻ type drift layer at a contact region, which provides a terminal structure (i.e., an outer periphery breakdown region). The terminal structure has a RESURF layer. A surface portion of the drift layer and a P type layer having a concentric pattern are arranged on an inner side of the RESURF layer. Thus, the PN junction diode is formed in a part of the Schottky junction.

This is a junction barrier Schottky (i.e., JBS) structure having two types of electronic property, which are Schottky diode property and PN diode property. The Schottky diode property provides I-V (i.e., current-voltage) characteristics such that the diode breaks down at a comparatively small voltage, and then, the current increases with a predetermined slope with respect to voltage increase. The PN diode property provides I-V characteristics such that the diode breaks down at a comparatively large voltage, and then, the current rapidly increases in avalanche manner.

In a conventional JBS structure, it is necessary to contact the Schottky electrode on the N⁻ type drift layer with Schottky contact. Thus, the Schottky electrode is made of metallic material capable of forming a Schottky barrier. Therefore, it is difficult to provide ohmic contact with the P type layer, thereby, it is difficult to utilize the advantage of the JBS structure effectively.

Thus, it is required to contact the Schottky electrode and an impurity layer composing the PN diode with the ohmic contact.

SUMMARY OF THE INVENTION

In view of the above-described problem, it is an object of the present disclosure to provide a SiC semiconductor device having a junction barrier Schottky diode.

According to a first aspect of the present disclosure, a semiconductor device having a junction barrier Schottky diode includes: a SiC substrate having a first conductive type and including first and second surfaces; a drift layer having the first conductive type, disposed on the first surface of the substrate, made of SiC, and having an impurity concentration, which is lower than that of the substrate; an insulation film disposed on the drift layer and having an opening in a cell region; a Schottky barrier diode having a Schottky electrode and an ohmic electrode, wherein the Schottky electrode is disposed in the cell region and contacts the drift layer through the opening of the insulation film with Schottky contact, and wherein the ohmic electrode is disposed on the second surface of the substrate; a terminal structure having a RESURF layer and disposed on an outer periphery of the cell region, wherein the RESURF layer has a second conductive type, surrounds the cell region, and is disposed in a surface portion of the drift layer; and a plurality of second conductive type layers, each of which is disposed in another surface portion of the drift layer on an inner side of the RESURF layer, contacts the Schottky electrode, wherein the second conductive type layers are separated from each other by a predetermined distance. The plurality of second conductive type layers and the drift layer provide a PN diode. The Schottky electrode includes a first Schottky electrode and a second Schottky electrode. The first Schottky electrode contacts each of the second conductive type layers with ohmic contact. The second Schottky electrode contacts the drift layer with the Schottky contact.

The above device has both of Schottky diode property and PN diode property.

According to a second aspect of the present disclosure, a semiconductor device having a junction barrier Schottky diode includes: a SiC substrate having a first conductive type and including first and second surfaces; a drift layer having the first conductive type, disposed on the first surface of the substrate, made of SiC, and having an impurity concentration, which is lower than that of the substrate; an insulation film disposed on the drift layer and having an opening in a cell region; a Schottky barrier diode having a Schottky electrode and an ohmic electrode, wherein the Schottky electrode is disposed in the cell region and contacts the drift layer through the opening of the insulation film with Schottky contact, and wherein the ohmic electrode is disposed on the second surface of the substrate; a terminal structure having a RESURF layer and disposed on an outer periphery of the cell region, wherein the RESURF layer has a second conductive type, surrounds the cell region, and is disposed in a surface portion of the drift layer; and a plurality of second conductive type layers, each of which is disposed in another surface portion of the drift layer on an inner side of the RESURF layer, contacts the Schottky electrode, wherein the second conductive type layers are separated from each other by a predetermined distance. The plurality of second conductive type layers and the drift layer provide a PN diode. Each of the second conductive type layers includes a surface portion and a deeper portion. The surface portion of each second conductive type layer is disposed on a first surface side of the substrate, and the deeper portion is disposed on a second surface side of the substrate. The surface portion of each second conductive type layer has an impurity concentration higher than that of the deeper portion; and the Schottky electrode contacts each of the second conductive type layers with ohmic contact.

The above device has both of Schottky diode property and PN diode property.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
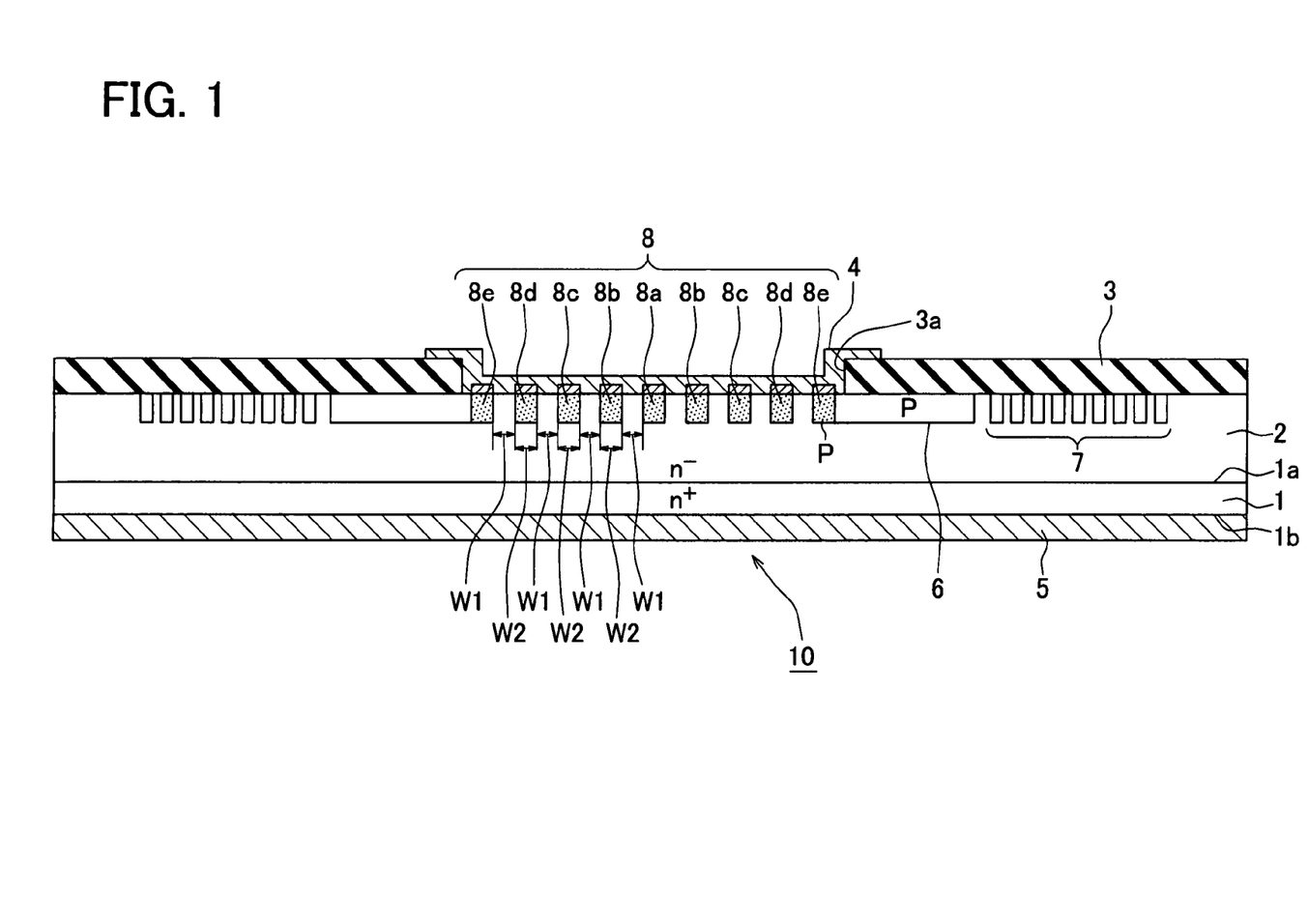
FIG. 1 is a cross sectional view showing a SiC semiconductor device having a JBS structure according to a first embodiment.
Figure 2:
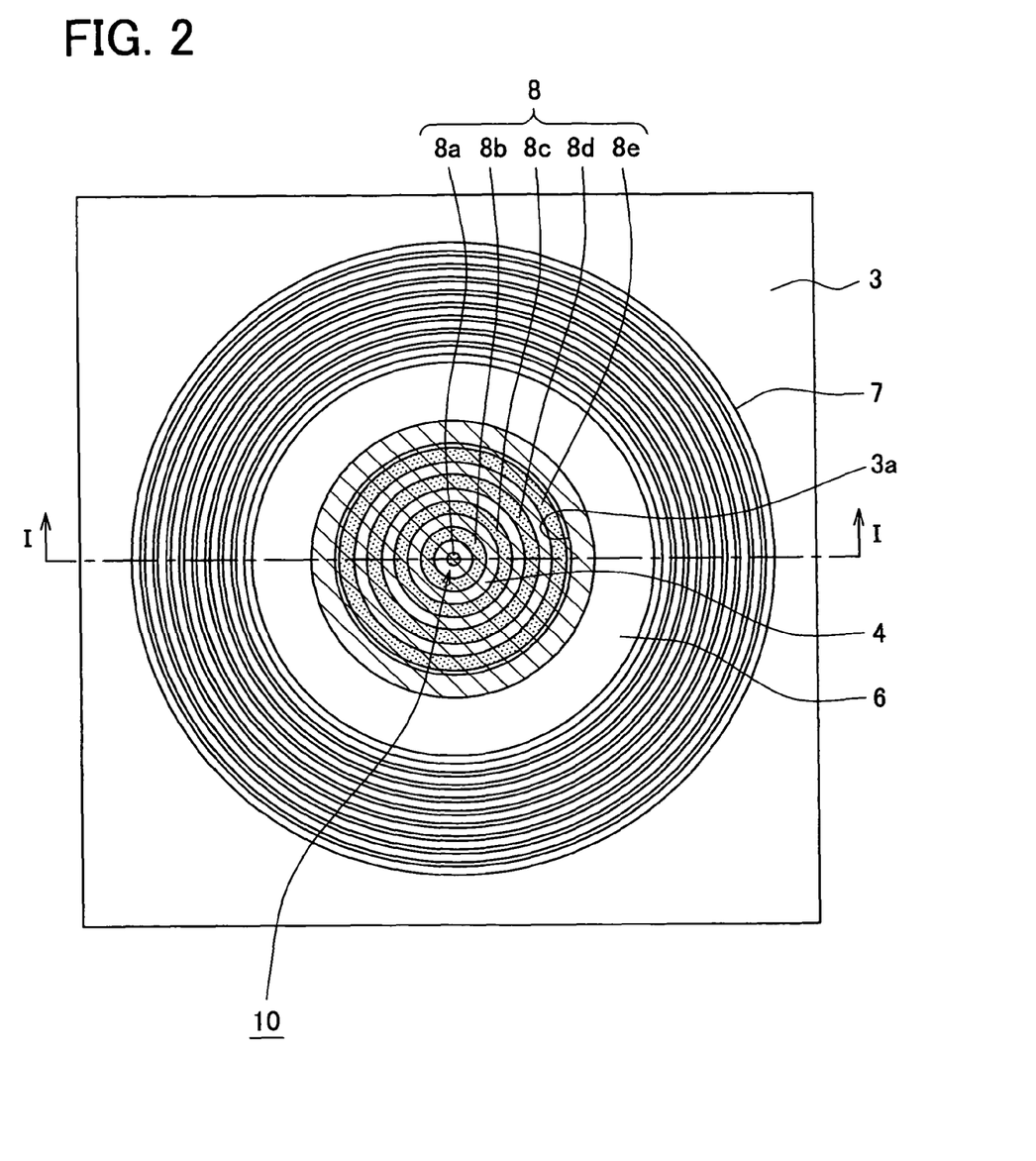
FIG. 2 is an upper layout view showing the SiC semiconductor device shown in FIG. 1.

FIG. 1 is a cross sectional view showing a SiC semiconductor device having a JBS structure taken along line I-I in FIG. 2.

The SiC semiconductor device is made from a. $N^+$ type substrate 1 made of SiC and having an impurity concentration, for example, in a range between $2\times10^{18}$ cm$^{-3}$ and $1\times10^{21}$ cm$^{-3}$. The substrate 1 has a principal surface 1a as an upper surface and a backside surface 1b as a lower surface, which is opposite to the principal surface 1a. On the principal surface 1a, a $N^-$ type drift layer 2 is stacked. The drift layer 2 is made of SiC and has an impurity concentration of $5\times10^{15}$ cm$^{-3}$ ($\pm 50\%$). A SBD structure 10 is formed in a cell region provided by the substrate 1 and the drift layer 2. A terminal structure is formed on an outer periphery region of the SBD structure 10. Thus, the semiconductor device includes the SBD structure 10 and the terminal structure.

Specifically, an insulation film 3 made of a silicon oxide film is formed on the surface of the drift layer 2. The insulation film 3 has an opening 3a, which is partially formed in the cell region. A Schottky electrode 4 is formed in the opening 3a of the insulation film 3. The Schottky electrode 4 contacts the drift layer 2 with Schottky contact. The Schottky electrode 4 is made of material mainly composed of Mo, Ti or Ni. The opening 3a has a circular shape, as shown in FIG. 2. The Schottky electrode 4 contacts the drift layer 2 with Schottky contact in the opening 3a. A part of the Schottky electrode 4, which contacts a P type layer 8, is made of other material.

An ohmic electrode 5 is formed on the backside of the substrate 1. The ohmic electrode 5 is made of Ni, Ti, Mo, W or the like. Thus, the SBD structure 10 includes the ohmic electrode 5, the Schottky electrode 4, the drift layer 2 and the substrate 1 in the cell region.

The terminal structure includes a RESURF layer 6 having a P type and multiple guard rings 7 having the P type. The RESURF layer 6 is disposed in a surface portion of the drift layer 2, and contacts the Schottky electrode 4. The RESURF layer 6 is disposed on both sides of the Schottky electrode 4. The guard rings 7 surround the outer periphery of the RESURF layer 6. The RESURF layer 6 includes an impurity such as Al, and has an impurity concentration in a range between $5\times10^{16}$ cm$^{-3}$ and $1\times10^{18}$ cm$^{-3}$. The RESURF layer 6 and the guard rings 7 have a ring shape so that the ring shape surrounds the cell region, as shown in FIG. 2. By forming the RESURF layer 6 and the guard rings 7, electric field can extend widely toward the outer periphery of the SBD structure 10 so that the electric field concentration is reduced. Thus, the breakdown voltage of the device increases.

The P type layer 8 is formed on an inner side of an inner edge of the RESURF layer 6. The inner edge of the RESURF layer 6 in the terminal structure is disposed on a cell region side. The P type layer 8 contacts the Schottky electrode 4. A PN diode is provided by the P type layer 8 and the $N^-$ type drift layer 2. Thus, the JBS structure is formed. The P type layer 8 has a ring shape, which is formed along with the outer periphery of the cell region, i.e., the outer periphery of the Schottky electrode 4. A center portion 8a of the P type layer 8 having a circular shape is disposed at a center of a contact region between the Schottky electrode 4 and the drift layer 2. Specifically, the center portion 8a is disposed at the center of the cell region. Multiple ring portions 8b-8e are concentrically arranged around the center portion 8a. In this embodiment, the number of the ring portions 8b-8e is four. An utmost outer ring portion 8e is disposed on an utmost outer periphery of the P type layer 8. The utmost outer ring portion 8e contacts the inner side of the RESURF layer 6 or embedded in the inside of the RESURF layer 6. Middle ring portions 8b-8d disposed between the center portion 8a and the utmost outer ring portion 8e are symmetrically arranged along with a cross section in a radial direction around the center portion 8a. Thus, the middle ring portions 8b-8d and the utmost outer ring portion 8e are spaced apart from each other at predetermined intervals W1. Further, a width W2 of each ring portion 8b-8e and the center portion 8a is the same. Each portion 8a-8e has an impurity concentration in a range between $5\times10^{17}$ cm$^{-3}$ and $1\times10^{20}$ cm$^{-3}$. The interval W1 is about 2.0 μm±0.5 μm, and the width W2 is about 1.5 μm±0.5 μm.

Figure 3:
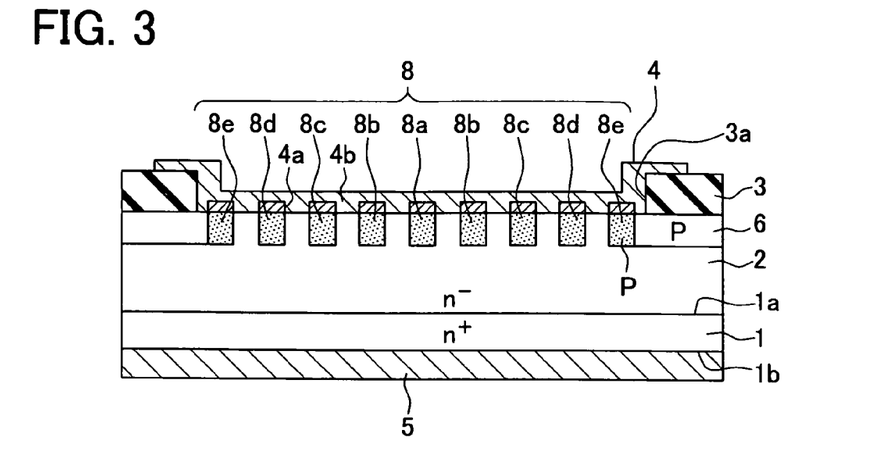
FIG. 3 is a partially enlarged cross sectional view showing the JBS structure of the SiC semiconductor device.

FIG. 3 shows the JBS structure in the device. Specifically, the Schottky electrode 4 includes a lower electrode 4a and an upper electrode 4b. The lower electrode 4a contacts the P type layer 8. The lower electrode 4a is made of, for example, Al, which is material capable of contacting the P type layer 8 with ohmic contact. The upper electrode 4b covers the lower electrode 4a. The upper electrode 4b is made of Mo, Ti or Ni. The upper electrode 4b contacts the drift layer 2. Thus, the upper electrode 4b contacts the drift layer 2 with Schottky contact, and the lower electrode contacts the P type layer 8 with ohmic contact. Thus, the JBS structure has Schottky diode property and PN diode property. The advantage of the JBS structure is effectively utilized.

In the device having the JBS structure, the Schottky electrode 4 provides an anode, and the ohmic electrode 5 provides a cathode. When a voltage more than a Schottky barrier voltage is applied to the Schottky electrode 4, the current flows between the Schottky electrode 4 and the ohmic electrode 5.

In the outer periphery region, when the diode is off, a depletion layer extends from the P type layer to the drift layer 2, which are disposed under the Schottky electrode 4. The depletion layer fully depletes the drift layer 2 sandwiched between the P type layer 8 by the depletion layer. Thus, when surge generates in the device, i.e., when a reverse voltage is applied to the device, a leak current is reduced.

The upper electrode 4b contacts the drift layer 2 with the Schottky contact, and the lower electrode 4a contacts the P type layer 8 with the ohmic contact. Thus, the JBS structure has the Schottky diode property and the PN diode property so that both properties can be effectively utilized.

The method for manufacturing the SiC semiconductor device will be explained as follows. In FIGS. 4A to 4D and 5A to 5C, the P type guard ring layer 7 is not shown.

Figure 4A:
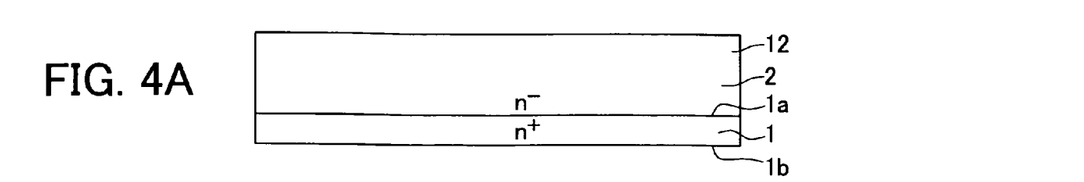
FIGS. 4A to 4D are partially enlarged cross sectional views showing a method for manufacturing the SiC semiconductor device.
Figure 4B:
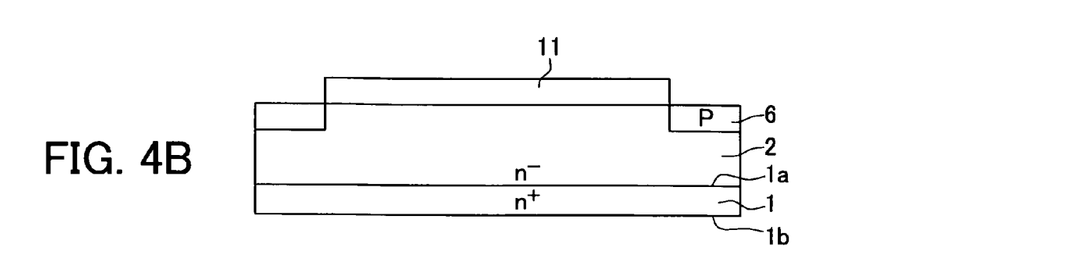

In a step shown in FIG. 4A, the drift layer 2 is formed on the principal surface 1a of the substrate 1 by an epitaxial growth method. In a step shown in FIG. 4B, a mask 11 made of a LTO (i.e., low temperature oxide) film is formed on the drift layer 2. Then, a part of the mask 11 is opened in a photo lithography etching method. The part of the mask 11 corresponds to a RESURF-layer-to-be-formed region and a guard-ring-to-be-formed region. By using the mask 11, a P type impurity such as Al is implanted on the drift layer 2, and then, the impurity is activated by a thermal process. Thus, the P type RESURF layer 6 and the P type guard ring layer 7 are formed.

Figure 4C:
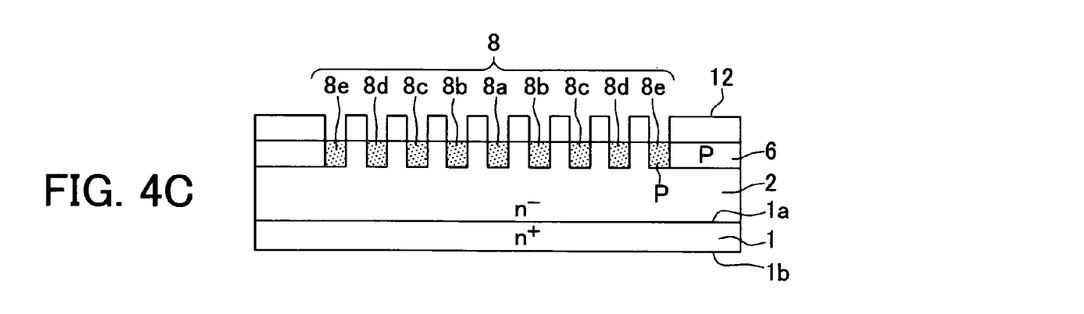

In FIG. 4C, the mask 11 is removed, and then, another mask 12 made of a LTO film or the like is formed on the substrate 1. A part of the mask 12 is opened in a photo lithography etching method. The part of the mask 12 corresponds to a P-type-layer-to-be-formed region. By using the mask 12, a P type impurity such as Al is implanted on the drift layer 2, and then, the impurity is activated by a thermal process. Thus, the P type layer 8 is formed. At this time, ion implantation energy in a P type layer forming process may be higher than that in a P type RESURF layer and P type guard ring layer forming process so that the P type impurity is deeply implanted in the drift layer 2. In FIG. 4C, the depth of the P type layer 8 is almost equal to that of the RESURF layer 6. Preferably, the depth of the P type layer 8 may be larger than that of the RESURF layer 6.

Figure 4D:
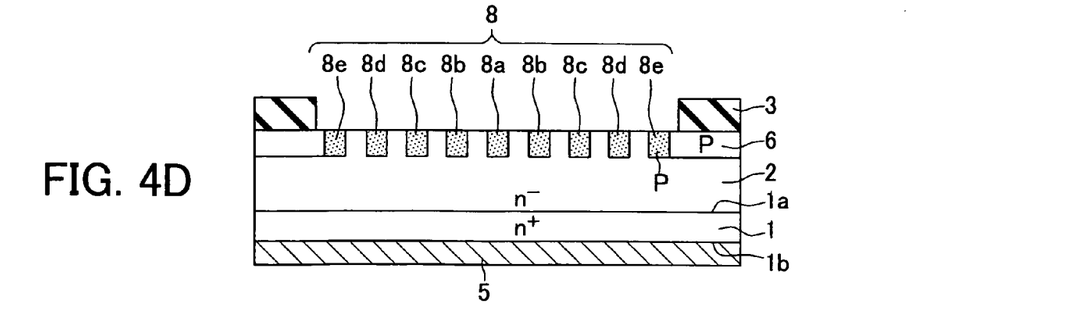

In a step shown in FIG. 4D, the mask 12 is removed. Then, a metallic layer made of, for example, Ni, Ti, Mo, W or the like is formed on the backside 1b of the substrate 1. Thus, the ohmic electrode 5 is formed. The SiC surface of the substrate 1 is cleaned by a sacrifice oxidation process, and then, a silicon oxide film is formed on substrate 1 by a plasma CVD method. The silicon oxide film is processed under a reflow process so that the insulation film 3 is deposited. Then, the insulation film 3 is etched in the photo lithography etching process so that the opening 3a is formed in the insulation film 3.

Figure 5A:
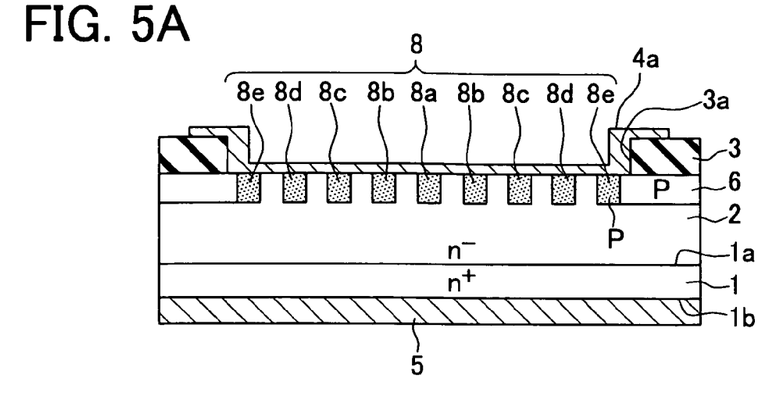
FIGS. 5A to 5C are partially enlarged cross sectional views showing the method for manufacturing the SiC semiconductor device.
Figure 5B:
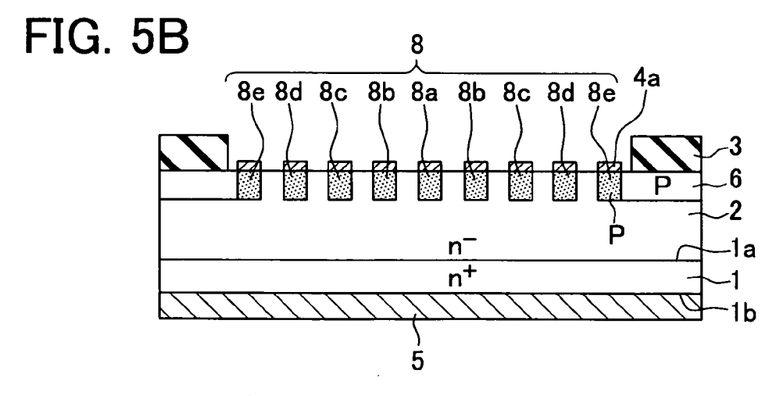

In a step shown in FIG. 5A, a metallic film made of Al or the like is formed on the insulation film 3 and in the opening 3a. In a step shown in FIG. 5B, the metallic film is patterned so that the lower electrode 4a is formed so as to contact the P type layer 8.

Figure 5C:
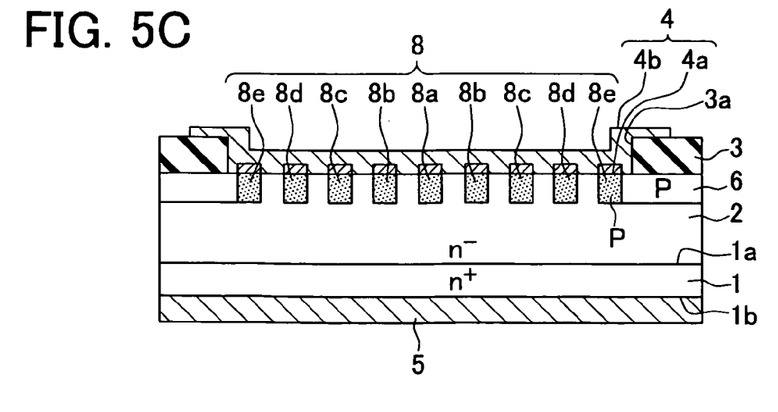

In a step shown in FIG. 5C, another metallic film made of Mo, Ti or Ni is formed on the insulation film 3 and in the opening 3a so as to cover the lower electrode 4a. The metallic film is patterned so that the upper electrode 4b is formed. Thus, the Schottky electrode 4 is formed. The SiC semiconductor device having the SBD 10 is completed.

In the device, the Schottky electrode 4 includes multiple electrode material layers. Specifically, the upper electrode 4b contacts the drift layer 2 with the Schottky contact, and the lower electrode 4a contacts the P type layer with the ohmic contact. Thus, each of the Schottky diode property and the PN diode property effectively functions.

Second Embodiment

Figure 6:
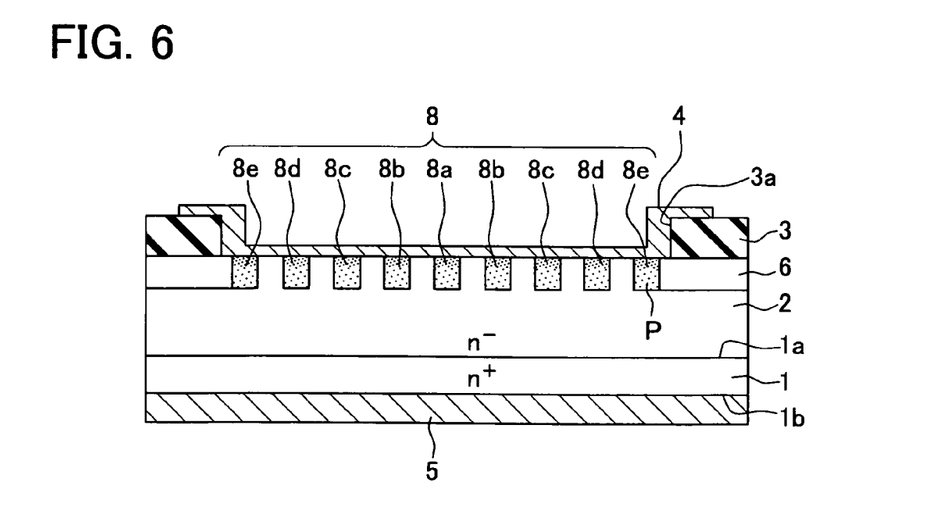
FIG. 6 is a partially enlarged cross sectional view showing a JBS structure of a SiC semiconductor device according to a second embodiment.

FIG. 6 shows a SiC semiconductor device according to a second embodiment. The Schottky electrode 4 is formed of only one layer made of Mo, Ti or Ni. The impurity concentration profile of the P type layer 8 in FIG. 6 is different from that in FIG. 1, so that the P type layer 8 and the Schottky electrode 4 are coupled with the ohmic contact.

The impurity concentration of the surface portion of the P type layer 8 is higher than that of a deeper portion of the P type layer 8. For example, the surface portion of the P type layer 8, which contacts the Schottky electrode 4, has the P type impurity concentration equal to or higher than $1 \times 10^{20}$ cm$^{-3}$. Thus, the P type layer 8 and the Schottky electrode 4 are coupled with the ohmic contact. By increasing the impurity concentration of a contact portion of the P type layer 8 with the Schottky electrode 4, each of the Schottky diode property and the PN diode property effectively functions.

The manufacturing method of the device is similar to that in FIGS. 4A to 5C. Specifically, in the step shown in FIG. 4C, the ion implantation profile of the P type layer 8 is changed from a constant profile to a certain contrasting concentration so that the surface portion of the P type layer has the higher impurity concentration than the deeper portion. Further, the steps shown in FIGS. 5A and 5B are skipped, thereby, the Schottky electrode 4 is formed with a Mo or Ti film.

Third Embodiment

Figure 7:
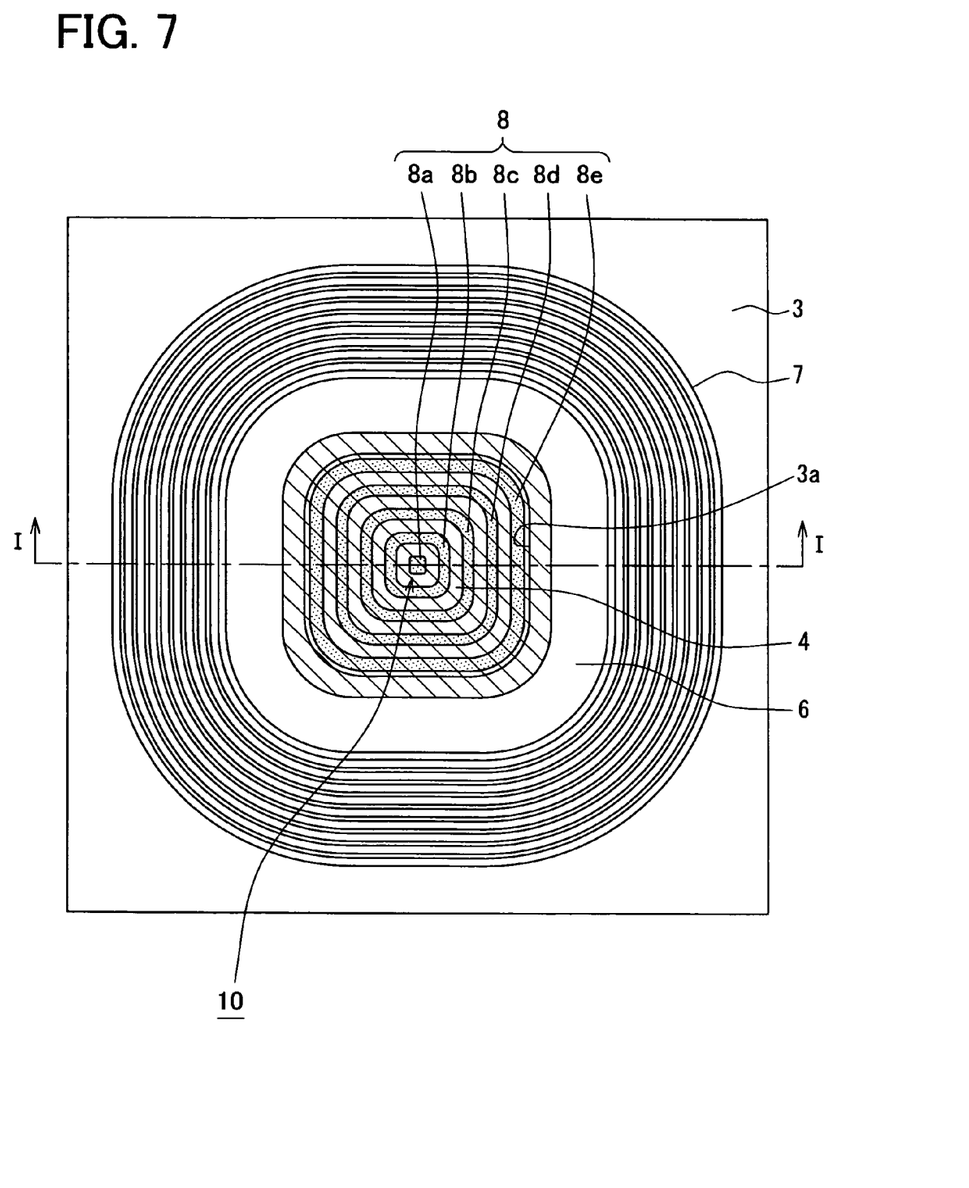
FIG. 7 is an upper layout view showing a SiC semiconductor device according to a third embodiment.

FIG. 7 shows a SiC semiconductor device having a JBS structure according to a third embodiment. The JBS structure and the outer periphery structure in FIG. 7 are different from those in FIG. 2. In FIG. 7, the RESURF layer 6 has a square shape with four rounded corners. The P type layer 8 including the center portion 8a and multiple ring portions 8b-8e has a square shape with four rounded corners. Specifically, the center portion 8a has the square shape with rounded corners, and each of the ring portions 8b-8e has the square shape with rounded corners, which surrounds the center portion 8a. The center portion 8a may be a circular shape.

Fourth Embodiment

Figure 8:
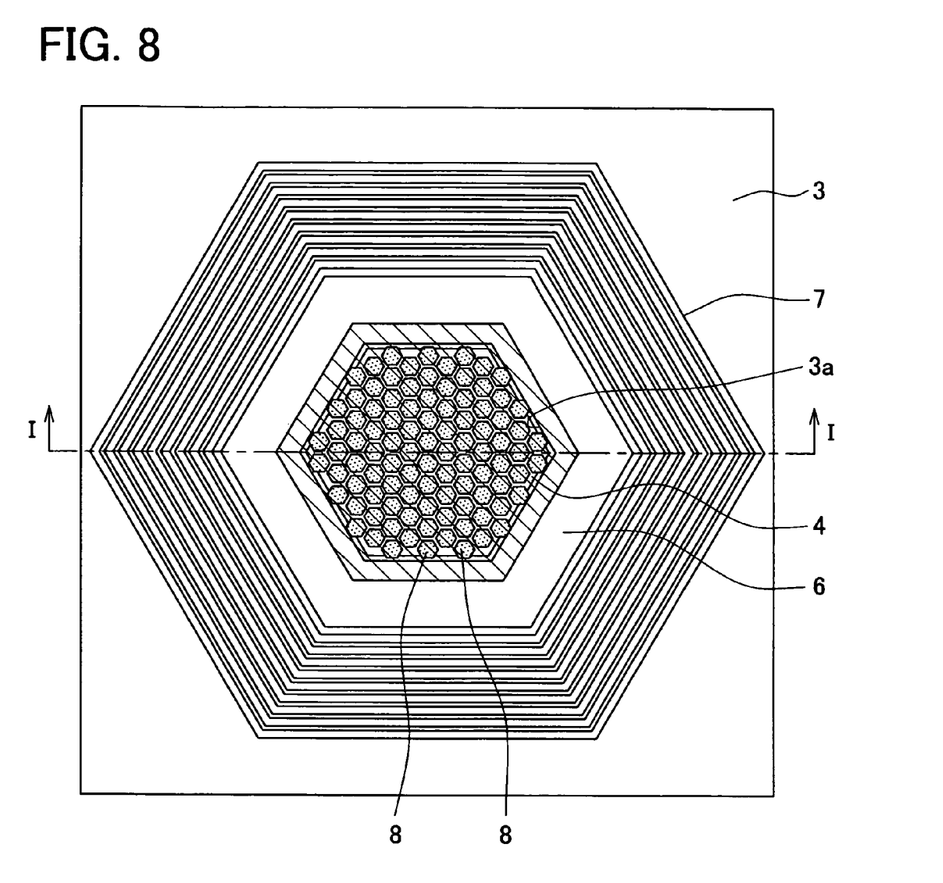
FIG. 8 is an upper layout view showing a SiC semiconductor device according to a fourth embodiment.

FIG. 8 shows a SiC semiconductor device having a JBS structure according to a fourth embodiment. The JBS structure and the outer periphery structure in FIG. 8 are different from those in FIG. 2.

The RESURF layer 6 has a hexagonal shape, and the P type layer 8 includes multiple honey comb structure. Each honey comb has a hexagonal shape. The P type layer 8 is disposed inside of the RESURF layer 6. Each honey comb has the same dimensions, and a distance between two adjacent honey combs is the same. Specifically, a part of the drift layer 2 sandwiched between two adjacent honey combs has an equivalent width. The honey combs have the point symmetry around the center of the Schottky electrode 4. Although the number of honey combs along with line I-I in FIG. 8 is six, the number of honey combs may be different from six.

(Modifications)

The number of the center portion 8a and the ring portions 8b-8e may be different from that in FIGS. 1-8. Although the shape of the RESURF layer 6 and the P type layer 8 is the square shape with the rounded corners in FIG. 7, the shape of the RESURF layer 6 and the P type layer 8 may be a polygonal with rounded corners. The P type layer 8 may have a stripe pattern shape. The depth of the P type layer 8 may be equal to that of the RESURF layer 6. Alternatively, the depth of the P type layer 8 may be larger than that of the RESURF layer 6.

The first conductive type is the N type, and the second conductive type is the P type. Alternatively, the first conductive type may be the P type, and the second conductive type may be the N type.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device having a junction barrier Schottky diode comprising:
   a SiC substrate having a first conductive type and including first and second surfaces;
   a drift layer having the first conductive type, disposed on the first surface of the substrate, made of SiC, and having an impurity concentration, which is lower than that of the substrate;
   an insulation film disposed on the drift layer and having an opening in a cell region;
   a Schottky barrier diode having a Schottky electrode and an ohmic electrode, wherein the Schottky electrode is disposed in the cell region and contacts the drift layer through the opening of the insulation film with Schottky contact, and wherein the ohmic electrode is disposed on the second surface of the substrate;
   a terminal structure having a RESURF layer and disposed on an outer periphery of the cell region, wherein the RESURF layer has a second conductive type, surrounds the cell region, and is disposed in a surface portion of the drift layer; and
   a plurality of second conductive type layers, each of which is disposed in another surface portion of the drift layer on an inner side of the RESURF layer, contacts the Schottky electrode, wherein the second conductive type layers are separated from each other by a predetermined distance, wherein:
   the plurality of second conductive type layers and the drift layer provide a PN diode;
   the Schottky electrode includes a first Schottky electrode and a second Schottky electrode;
   the first Schottky electrode contacts each of the second conductive type layers with ohmic contact;
   the second Schottky electrode contacts the drift layer with the Schottky contact,
   the plurality of second conductive type layers includes a center portion and a plurality of ring portions;
   the center portion is disposed at a center of the cell region;
   each of the ring portions surrounds the center portion and has a point symmetry around the center portion;
   the plurality of ring portions includes an utmost outer ring portion, which is disposed on an utmost outer side of the ring portions;
   the plurality of ring portions includes a plurality of middle ring portions, which is disposed between the utmost outer ring portion and the center portion;
   each ring portion has a cross section taken along a radial direction; and
   the cross sections of the middle ring portions have a line symmetry with respect to the center of the cell region.

2. The semiconductor device according to claim 1, wherein:
   the first Schottky electrode provides a lower electrode, and the second Schottky electrode provides an upper electrode; and
   the second Schottky electrode covers the first Schottky electrode.

3. The semiconductor device according to claim 1, wherein:
   the first conductive type is a N type, and the second conductive type is a P type; and
   the first Schottky electrode is made of aluminum, Ti or Ni which is capable of contacting a P type conductor with the ohmic contact.

4. The semiconductor device according to claim 3, wherein:
   the second Schottky electrode is made of Ti, Mo, or Ni; and
   the ohmic electrode is made of Ni, Ti, Mo, or W.

5. The semiconductor device according to claim 4, wherein:
   the terminal structure further includes a plurality of guard rings, each of which has the second conductive type; and
   each guard ring surrounds the RESURF layer, and is disposed in further another surface portion of the drift layer.

6. The semiconductor device according to claim 1, wherein:
   the ring portions are concentrically arranged around the center portion.

7. The semiconductor device according to claim 1, wherein:
   the center portion has a polygonal shape with rounded corners; and
   each ring portion has a polygonal shape with rounded corners.

8. The semiconductor device according to claim 1, wherein:
   the utmost outer ring portion contacts an inner edge of the RESURF layer or is embedded in the RESURF layer.

* * * * *